(12) United States Patent
Chang et al.

(10) Patent No.: US 9,543,387 B2
(45) Date of Patent: Jan. 10, 2017

(54) SEMICONDUCTOR DEVICE AND MANUFACTURING METHOD THEREOF

(71) Applicant: TAIWAN SEMICONDUCTOR MANUFACTURING COMPANY LTD., Hsinchu (TW)

(72) Inventors: Shih-Chieh Chang, Taipei (TW);
Ying-Min Chou, Tainan (TW);
Yi-Ming Huang, Tainan (TW);
Wen-Chu Hsiao, Tainan (TW);
Hsiu-Ting Chen, Tainan (TW);
Huai-Tei Yang, Hsin-Chu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/202,616

(22) Filed: Mar. 10, 2014

(65) Prior Publication Data
US 2015/0255578 A1    Sep. 10, 2015

(51) Int. Cl.
*H01L 29/08* (2006.01)
*H01L 29/66* (2006.01)
*H01L 29/78* (2006.01)
*H01L 21/02* (2006.01)
*H01L 29/165* (2006.01)

(52) U.S. Cl.
CPC ....... *H01L 29/0847* (2013.01); *H01L 29/0843* (2013.01); *H01L 29/0886* (2013.01); *H01L 29/66628* (2013.01); *H01L 29/66636* (2013.01); *H01L 29/78* (2013.01); *H01L 29/7848* (2013.01); *H01L 21/02381* (2013.01); *H01L 29/0869* (2013.01); *H01L 29/165* (2013.01); *H01L 29/665* (2013.01)

(58) Field of Classification Search
CPC .......... H01L 29/0847; H01L 29/66628; H01L 29/7848; H01L 29/0886; H01L 29/78; H01L 29/66636; H01L 29/0843
See application file for complete search history.

(56) References Cited

U.S. PATENT DOCUMENTS 8,652,915 B2 *  2/2014  Ahn .................. H01L 21/02532
                                                257/E21.619
2007/0254414 A1 * 11/2007  Miyanami ............. H01L 29/165
                                                438/149

(Continued)

*Primary Examiner* — Matthew Reames
*Assistant Examiner* — Vincent Wall
(74) *Attorney, Agent, or Firm* — Chun-Ming Shih

(57) ABSTRACT

A semiconductor device includes a gate structure located on a substrate and a raised source/drain region adjacent to the gate structure. The raised source/drain region includes: a first epitaxial-grown doped layer of the raised source/drain region in contact with the substrate; a second epitaxial-grown doped layer on the first epitaxial-grown doped layer and including a same dopant species as the first epitaxial-grown doped layer, wherein the second epitaxial-grown doped layer includes a higher dopant concentration than the first epitaxial-grown doped layer and interfacing the gate structure by using a predetermined distance; and a third epitaxial-grown doped layer on the second epitaxial-grown doped layer and including the same dopant species as the first epitaxial-grown doped layer, wherein the third epitaxial-grown doped layer includes a higher dopant concentration than the second epitaxial-grown doped layer.

20 Claims, 7 Drawing Sheets

(56) References Cited

U.S. PATENT DOCUMENTS

| | | |
|---|---|---|
| 2009/0075029 A1* | 3/2009 | Thomas et al. ............... 428/173 |
| 2010/0163983 A1* | 7/2010 | Choi ............................. 257/336 |
| 2010/0308405 A1* | 12/2010 | Cai et al. ...................... 257/347 |
| 2011/0147828 A1* | 6/2011 | Murthy et al. ................ 257/327 |
| 2014/0087537 A1* | 3/2014 | Kim .................. H01L 29/66477 438/301 |
| 2014/0246710 A1* | 9/2014 | Tsai et al. ..................... 257/288 |
| 2015/0206946 A1* | 7/2015 | Chen et al. ....... H01L 29/41783 |

* cited by examiner

SEMICONDUCTOR DEVICE AND MANUFACTURING METHOD THEREOF

FIELD

The present disclosure relates to a semiconductor device and in particular, to a semiconductor device with a better electrical performance and a method of manufacturing a semiconductor device.

BACKGROUND

A significant trend throughout integrated circuit (IC) development is the downsizing of IC components. As the size reduces, the performance requirements become more stringent. Also, as devices continue to shrink in size, the channel region continues to shrink as well. For metal-oxide-semiconductor field effect transistors (MOSFETs), increased performance requirements have generally been met by aggressively scaling the length of the channel region. However, such a short channel length faces high electric field and manufacturing limits.

As the length of a channel continues to shrink, diffusion of dopants becomes much harder to control. There are various thermal processes throughout a semiconductor manufacturing. For example, after dopants are implanted into a substrate, a thermal process is used to activate the dopants. However, these thermal processes cause dopant diffusion in an unintentional way. In addition, shorter channel lengths suffer from fluctuation of higher implantation concentration and depth. As the dopant concentration reaches about 1E20 atoms/cm$^3$, the dopants will easily diffuse into channel regions and induce short channel effects during a thermal process. The electrical properties, such as threshold voltage, are altered and deviated from a predetermined value. This causes uniformity between each device and is a severe problem in circuit design. As such, a sufficient method to control the doped profile is required.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
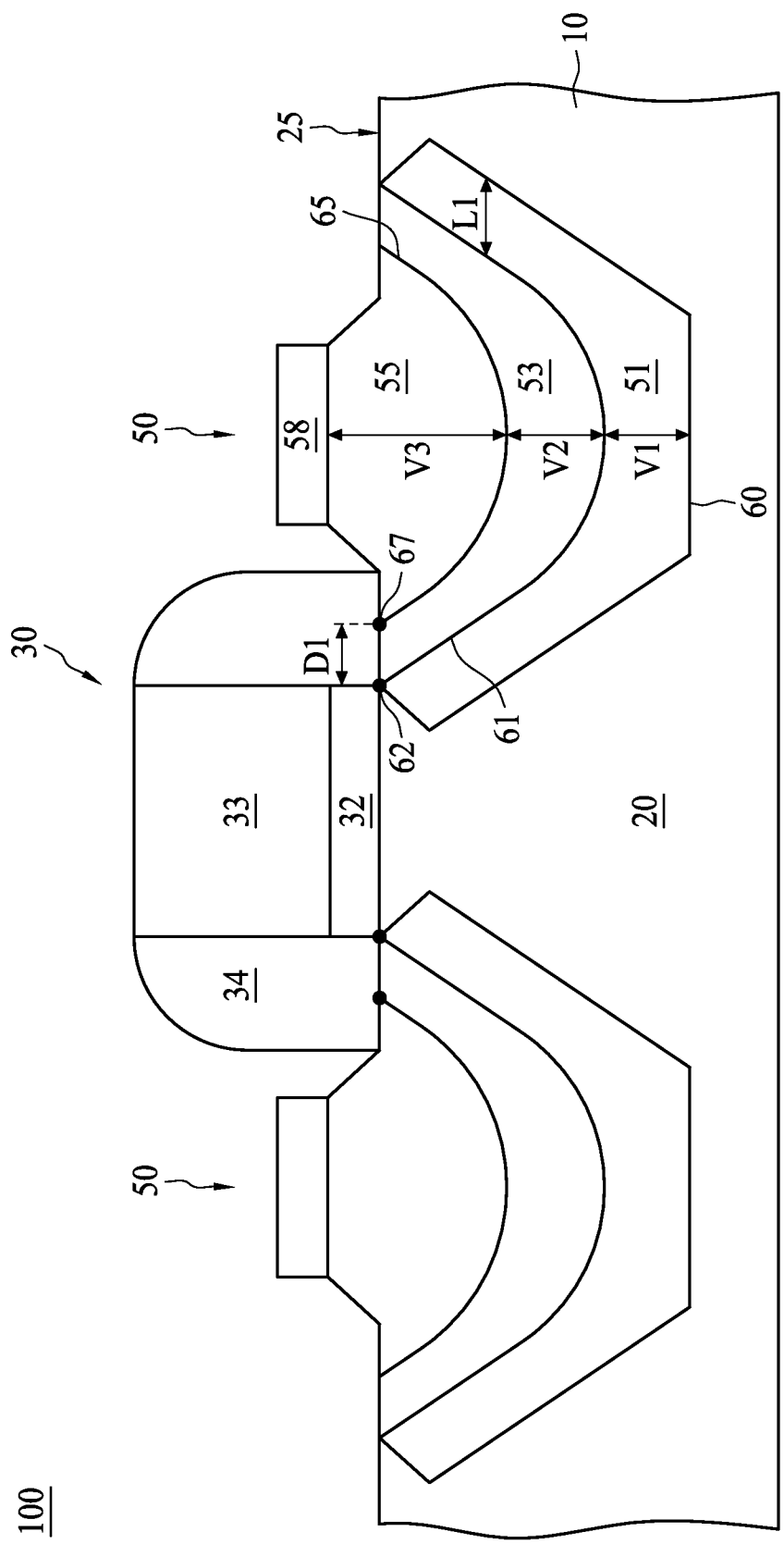
FIG. 1 is a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The terms "wafer" and "substrate," as used herein, are to be understood as including silicon, silicon-on-insulator (SOI) technology, silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous processing steps may have been utilized to form regions, junctions, or material layers in or over the base semiconductor structure or foundation. In addition, the semiconductor need not be silicon-based, but could be based on silicon-germanium, germanium, gallium arsenide or other semiconductor structures.

The terms "deposition" and "deposit," as used herein, refer to operations of depositing materials on a substrate using a vapor phase of a material to be deposited, a precursor of the material, and an electrochemical reaction or sputtering/reactive sputtering. Depositions using a vapor phase of a material include any operations such as, but not limited to, chemical vapor deposition (CVD) and physical vapor deposition (PVD). Examples of vapor deposition methods include hot filament CVD, rf-CVD, laser CVD (LCVD), conformal diamond coating operations, metal-organic CVD (MOCVD), thermal evaporation PVD, ionized metal PVD (IMPVD), electron beam PVD (EBPVD), reactive PVD, atomic layer deposition (ALD), plasma enhanced CVD (PECVD), high density plasma CVD (HDPCVD), low pressure CVD (LPCVD), and the like. Examples of deposition using an electrochemical reaction include electroplating, electro-less plating, and the like. Other examples of deposition include pulse laser deposition (PLD) and atomic layer deposition (ALD).

As the length of a channel region continues to shrink in a semiconductor device, diffusion of dopants becomes much harder to control. There are various thermal processes throughout a semiconductor manufacturing. However, these thermal processes cause dopant diffusion in an unintentional way. Diffused dopants may penetrate into a channel region. A gate barrier (band structure) is implemented for induced lowering by the diffused dopants in the channel region. As such, the unintentional dopants cause drain induced barrier lowering (DIBL) degradation. Drain induced barrier lowering (DIBL) is a short-channel effect in metal oxide semiconductor field-effect transistors (MOSFETs), referring to a reduction of threshold voltage of the transistor at higher drain voltages. In a MOSFET with a long channel, the bottleneck in the channel formation occurs far enough from the drain contact so that it is electrostatically shielded from the drain. As such, the threshold voltage is independent of drain voltage. However, in short-channel devices, the drain is close enough to gate the channel so that a high drain voltage can open the bottleneck and turn on the transistor prematurely. Dopants in the source/drain regions easily diffuse into the channel region so that the channel region is influenced by the diffused dopants, whereby serious DIBL degradation will occur. As a result, it is difficult for IC designers to control the doped profile. The present disclosure provides a source/drain region structure that prevents dopants from penetrating into the channel region.

In reference to the Figures, FIG. 1 is a semiconductor device 100 in accordance with some embodiments of the present disclosure. The semiconductor device 100 is formed on a substrate 10. In an embodiment, the substrate 10 is an SOI substrate. The SOI substrate includes a bulk silicon layer, a buried insulation layer and an active layer, wherein semiconductor devices are formed in and above the active layer. In an embodiment, the substrate 10 is a silicon substrate or made of materials other than silicon, for example, silicon germanium, silicon carbide, germanium, III-V compound semiconductors.

The semiconductor device 100 is a p-type MOSFET or an n-type MOSFET. The semiconductor device 100 includes a gate structure 30, a substrate 10, a channel region 20, and raised source/drain regions 50. The gate structure 30 further includes a gate dielectric 32, a gate electrode 33, and sidewall spacers 34.

With regard to the semiconductor device 100, the gate structure 30 is located on the substrate 10. The channel region 20 is disposed below the gate structure 30. The raised source/drain regions 50 are disposed on opposite sides of the gate structure 30. A portion of the raised source/drain region 50 is located underneath the gate structure 30. The sidewall spacers 34 conform to a stack of the gate electrode 33 and the gate dielectric 32.

The channel region 20 is disposed under the gate structure 30. The channel region 20 is formed in the substrate 10. In an embodiment, the channel region 20 is n-type and includes dopants, for example, phosphorous, arsenic, and/or antimony. In an embodiment, the channel region 20 is p-type and includes dopants, for example, boron, germanium, and/or indium.

The gate dielectric 32 is located on the channel region 20. In some embodiments, the gate dielectric 32 includes silicon dioxide or, in an alternative embodiment, a high dielectric constant (K) material. In some embodiments, the gate dielectric 32 includes a dielectric material based on silicon oxide, e.g., silicon oxynitride, silicon oxide, or a stack of at least one silicon oxide and at least one silicon nitride. In some embodiments, the gate dielectric 32 includes a dielectric metal oxide having a dielectric constant greater than 8.0, which is known as a high-k dielectric material. Exemplary high-k dielectric materials include $HfO_2$, $ZrO_2$, $La_2O_3$, $Al_2O_3$, $TiO_2$, $SrTiO_3$, $LaAlO_3$, $HfO_xN_y$, $Y_2O_3$, $LaAlO_xN_y$, $Al_2O_xN_y$, $ZrO_xN_y$, $La_2O_xN_y$, $TiO_xN_y$, $SrTiO_xN_y$, $Y_2O_xN_y$, and an alloy thereof. Each value of x is independently from 0.1 to 3.0 and each value of y is independently from 0.1 to 2.0.

The gate electrode 33 is located on the gate dielectric 32. In some embodiments, the gate electrode 33 includes standard polysilicon. In some embodiments, the gate electrode 33 includes amorphous polysilicon material, a metal material, silicided metal material, or a stack of at least one metallic material and at least one semiconductor material. The gate electrode 33 serves as a gate terminal in order to control the channel region 20. The material is chosen to meet the requirement of resistance.

The sidewall spacers 34 conform to the stack of the gate electrode 33 and the gate dielectric 32. In addition, the sidewall spacers 34 are respectively located on opposite sides of the stack. In some embodiments, the sidewall spacers 34 include silicon nitride. In some embodiments, the sidewall spacers 34 include silicon dioxide, silicon carbide, or silicon oxy-nitride, without limitation. Specifically, material of the sidewall spacers 34 is different from the material of the gate electrode 33 or the gate dielectric 32.

The raised source/drain region 50 is disposed adjacent to the gate structure 30. The raised source/drain regions 50 are formed, for example, by epitaxial growth of a semiconductor material within a cavity in the substrate 10. Because the epitaxial growth forms the raised source/drain regions 50 layer by layer, it is sufficient to control profile and dopant concentrations of the raised source/drain regions 50. The raised source/drain region 50 includes a first epitaxial-grown doped layer 51, a second epitaxial-grown doped layer 53, and a third epitaxial-grown doped layer 55. Those epitaxial-grown doped layers are also regarded as epitaxial-grown doped liners that fill up a cavity of the substrate 10. The first epitaxial-grown doped layer 51 makes contact with the substrate 10. Specifically, the first epitaxial-grown doped layer 51 is located in a cavity within the substrate 10. The first epitaxial-grown doped layer 51 is thus a U-shaped or a V-shaped structure in the substrate 10. The second epitaxial-grown doped layer 53 is located on the first epitaxial-grown doped layer 51. The second epitaxial-grown doped layer 53 includes a same dopant species as the first epitaxial-grown doped layer 51, for example, n-type or p-type dopants. The second epitaxial-grown doped layer 51 includes a higher dopant concentration than the first epitaxial-grown doped layer 51. Particularly, the second epitaxial-grown doped layer 51 interfaces with the gate structure 30 by using a predetermined distance. The third epitaxial-grown doped layer 55 is located on the second epitaxial-grown doped layer 53. Similarly, the third epitaxial-grown doped layer 55 includes the same dopant species as the first epitaxial-grown doped layer 51, wherein the third epitaxial-grown doped layer 55 includes a higher dopant concentration than the second epitaxial-grown doped layer 53. In addition, an end portion of the third epitaxial-grown doped layer 55 is under the gate structure 30. A central portion of the third epitaxial-grown doped layer 55 raises from a surface 25 of the substrate 10.

The first epitaxial-grown doped layer 51 includes an epitaxial semiconductor material that is the same as that of the second epitaxial-grown doped layer 53 and the third epitaxial-grown doped layer 55. The epitaxial semiconductor material includes, for example, silicon germanium, silicon carbide, single crystalline silicon or any single crystalline semiconductor material that can be epitaxially grown. The raised source/drain regions 50, which include germanium or carbon, provide a tensile or a compress strain to the channel region 20. The epitaxial-grown doped layers include an in-situ doped single crystalline semiconductor material. The in-situ dopant is opposite to the polarity of the channel region 20 including, for example, boron, germanium, indium, phosphorous, arsenic, and/or antimony. The first epitaxial-grown doped layer 51 includes a dopant concentration ranging from about 1e19 atoms per $cm^3$ to about 2e20 atoms per $cm^3$. The second epitaxial-grown doped layer 53 includes a dopant concentration ranging from about 2e20 atoms per $cm^3$ to 6e20 atoms per $cm^3$. The third epitaxial-grown doped layer 55 includes a dopant concentration ranging from about 6e20 atoms per $cm^3$ to 2e21 atoms per $cm^3$. In an embodiment, the third epitaxial-grown doped layer 55 includes a dopant concentration from about 10 to 100 times higher than that of the second epitaxial-grown doped layer 53.

The second epitaxial-grown doped layer 53 interfaces the gate structure 30 by using a predetermined distance. That is, an end portion of the second epitaxial-grown doped layer 53 makes contact with the gate structure 30. End portions of the first and second epitaxial-grown doped layers (53, 55) are underneath the gate structure 30 so as to form an epitaxy-tip region. The end portion of the first epitaxial-grown doped layer 51 is more proximal to the channel region 20 than the end portion of the second epitaxial-grown doped layer 53. The epitaxy-tip region reduces the overall resistance of the semiconductor 100 by doping the region between the raised source/drain region 50 and the channel region 20.

The first epitaxial-grown doped layer 51 and the second epitaxial-grown doped layer 53 form an interface 61. The second epitaxial-grown doped layer 53 and the third epitaxial-grown doped layer 55 form an interface 65. An end 62 of the interface 61 and an end 67 of the interface 65 separately intersect the bottom of the gate structure 30. The end 62 is apart from the end 67 by a lateral thickness D1. The lateral thickness D1 of the second epitaxial-grown doped layer 53 is in a range from about 1 angstroms to 100 angstroms. That is, an end of the second epitaxial-grown doped layer 53 includes the lateral thickness D1 measured from the end 62 of the first epitaxial-grown doped layer 51 on the surface 25. The third epitaxial-grown doped layer 55 is encompassed by the second epitaxial-grown doped layer 53. The lateral thickness D1 separates the third epitaxial-grown doped layer 55 from the channel region 20. A path at the end portion of the second epitaxial-grown doped layer 53 near the gate structure 30 is grown thicker so as to block dopant diffusion. In an optional thermal process, dopants of the third epitaxial-grown doped layer 55 are confined within the second epitaxial-grown doped layer 53. The dopants of the third epitaxial-grown doped layer 55 cannot penetrate into the channel region 20 along the end portion of the second epitaxial-grown doped layer 53 near the surface 25. Therefore, the lateral thickness D1 of the second epitaxial-grown doped layer 53 is regarded as a barrier that prevents the third epitaxial-grown doped layer 55 from unintentional diffusion. In addition, the lateral thickness D1 also prevents the semiconductor device 100 from drain-induced barrier lowering (DIBL) degradation since the dopant diffusion is well controlled.

The first epitaxial-grown doped layer 51 includes a first vertical thickness V1 measuring from its bottom portion. The second epitaxial-grown doped layer 55 includes a second vertical thickness V2 measuring from its bottom portion. A ratio between the second vertical thickness V2 and the first vertical thickness V1 is greater than about 0.8. The third epitaxial-grown doped layer 55 includes a third vertical thickness V3. A ratio between the third vertical thickness V3 and a combination of the first vertical thickness V1 and the second vertical thickness V2 is less than about 0.5. In an embodiment, the first epitaxial-grown doped layer 51 includes a lateral thickness L1 and the first vertical thickness V1. A ratio between the lateral thickness L1 and the first vertical thickness V1 is less than about 1. A ratio between the lateral thickness D1 and the second vertical thickness V2 of the second epitaxial-grown doped layer 53 is in a range from 100 to 300 angstroms. Under the above conditions, the semiconductor device 100 provides a better electrical property. For example, threshold voltage of the semiconductor device 100 will be controlled in a predetermined value. Since the epitaxial-grown doped layers obtain the above ratios, dopants in each epitaxial-grown doped layer are also controlled so that unintentional diffusion will not occur. Therefore, serious DIBL can be substantially reduced.

A portion of the third epitaxial-grown doped layer 55 is underneath the gate structure 30. Another portion of the third epitaxial-grown doped layer 55 raises from the surface 25. By controlling the time of the epitaxial growth, the third epitaxial-grown doped layer 55 is able to raise or elevate from the surface 25. A metal silicide region 58 is located on the third epitaxial-grown doped layer 55. Further, the metal silicide region 58 is formed by an upper portion of the third epitaxial-grown doped layer 55. The metal silicide region 58 refers to a self-aligned silicide region. The metal silicide region 58 includes NiSi, PtSi or TiSi. The metal silicide region 58 reduces the metal-silicon contact resistivity by employing different metals and/or co-implants at the silicon-contact interface in order to reduce the Schottky barrier height.

Figure 2:
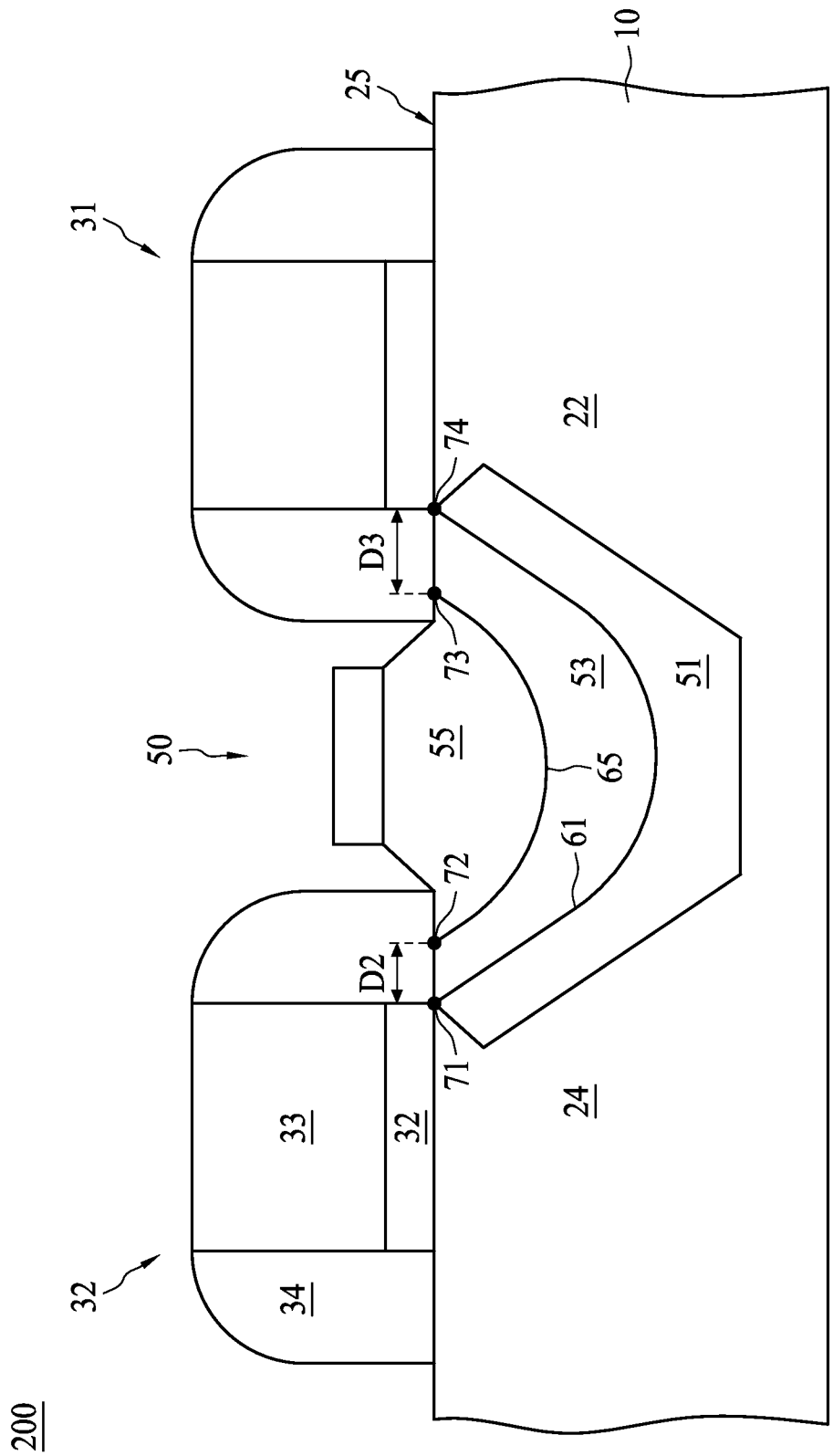
FIG. 2 is a semiconductor device in accordance with some embodiments of the present disclosure.

FIG. 2 is a semiconductor device 200 in accordance with some embodiments of the present disclosure. The raised source/drain region 50 is disposed between gate structures 31 and 32. The gate structures 31 and 32 are the same as the gate structure 30. The second epitaxial-grown doped layer 53 separately interfaces the gate structures 31 and 32 by using a predetermined distance. That is, two end portions of the second epitaxial-grown doped layer 53 make contact with the gate structures 31 and 32. An end of the second epitaxial-grown doped layer 53 includes a lateral thickness D2 measuring from an end 71 of the first epitaxial-grown doped layer 51 on the surface 25. That is, the lateral thickness D2 is equal to a distance between the end 71 and an end 72 of the interface 65. Another end of the second epitaxial-grown doped layer 53 includes a lateral thickness D3 measuring from an end 74 of the first epitaxial-grown doped layer 51 on the surface 25. That is, the lateral thickness D3 is equal to a distance between the end 74 and an end 73 of the interface 65. The lateral thicknesses D2 and D3 separate the third epitaxial-grown doped layer 55 from channel regions 22 and 24 under the gate structures 31 and 32. Therefore, the lateral thicknesses D2 and D3 of the second epitaxial-grown doped layer 53 are regarded as barriers that prevent the third epitaxial-grown doped layer 55 from unintentional diffusion. In addition, the lateral thicknesses D2 and D3 also prevent the semiconductor device 200 from drain-induced barrier lowering (DIBL) degradation since the dopant diffusion is well controlled.

FIGS. 3A-3E are cross-sectional diagrams illustrating a manufacturing process of the semiconductor device 200 of FIG. 2 in accordance with some embodiments of the present disclosure. Each figure may refer to a step of a process for manufacturing the semiconductor device 200. The manufacturing process of the semiconductor device 200 is similar to a manufacturing process of the semiconductor device 100.

Figure 3A:
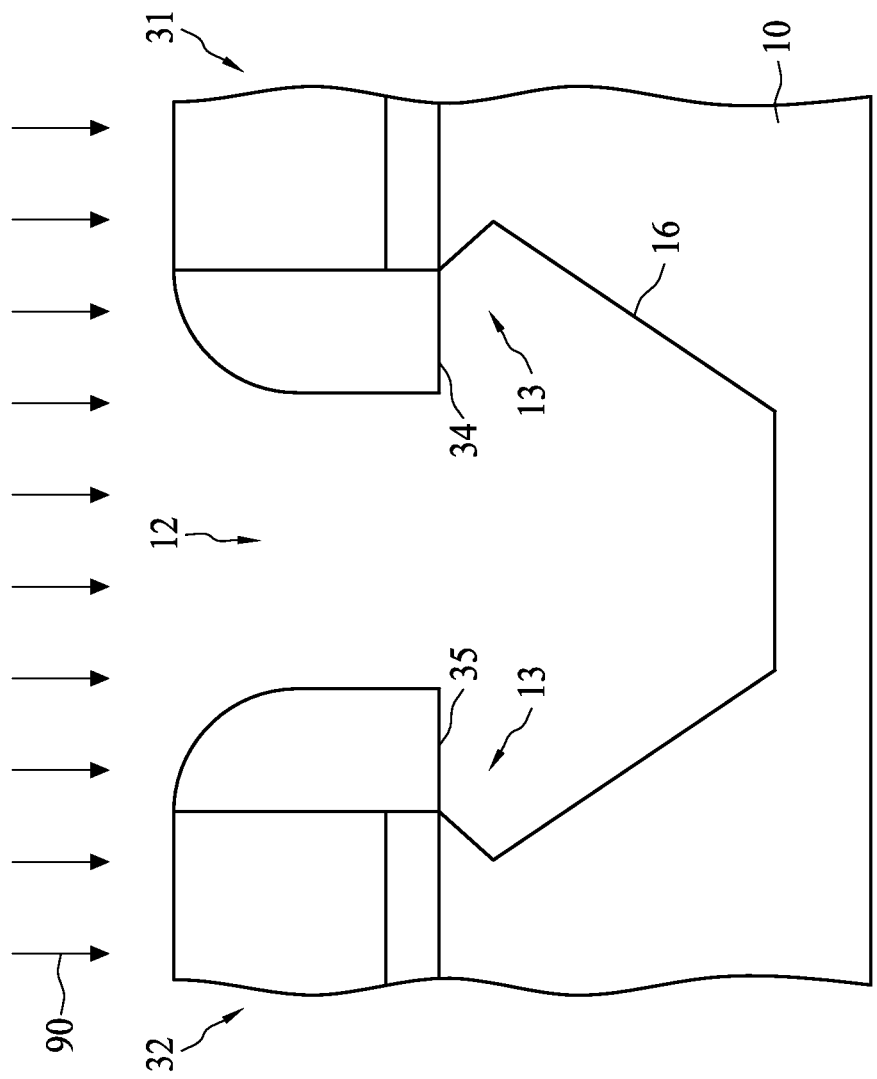
FIGS. 3A-3E are cross-sectional diagrams illustrating a manufacturing process of the semiconductor device of FIG. 2 in accordance with some embodiments of the present disclosure.

First, the semiconductor device 200 provides a substrate 10 including gate structures 31 and 32 on the substrate 10. Referring to FIG. 3A, a cavity 12 is formed in the substrate 10 and adjacent to the gate structures 31 and 32 by using an etch process 90, wherein the gate structures 31 and 32 serve as masks. The cavity 12 further includes corners 13 encroaching under the gate structures 31 and 32. The cavity 12 is vertically formed into the substrate 10 with a depth, for example, between about 10 nm and about 70 nm. It is also within the scope of the disclosure to etch the cavity 12 to any suitable depth. In addition, the etching process 90 is an isotropic etch that undercuts a portion of the substrate 10 under the gate structures 31 and 32. For example, the etching process 90 is a wet etching process. The etching process 90 undercuts the substrate 10 under the gate structures 31 and 32 so as to form the corners 13 between bottom surfaces 34 and 35 of the gate structures 31 and 32 and a bottom surface 16. The corners 13 can be regarded as epitaxy-tip cavities. As a result, the corners 13 expose bottom portions of the gate structures 31 and 32. The bottom surface 16 extends laterally beneath the gate structures 31 and 32. The bottom surface 16 is a U-shaped profile or a polygon profile.

In an embodiment, a hydrogen bake treatment is performed on the bottom surface 16 for pre-treatment. The hydrogen bake treatment desorbs oxygen and renders surface reconstruction so that the bottom surface 16 can readily nucleate without formation of defects.

Figure 3B:
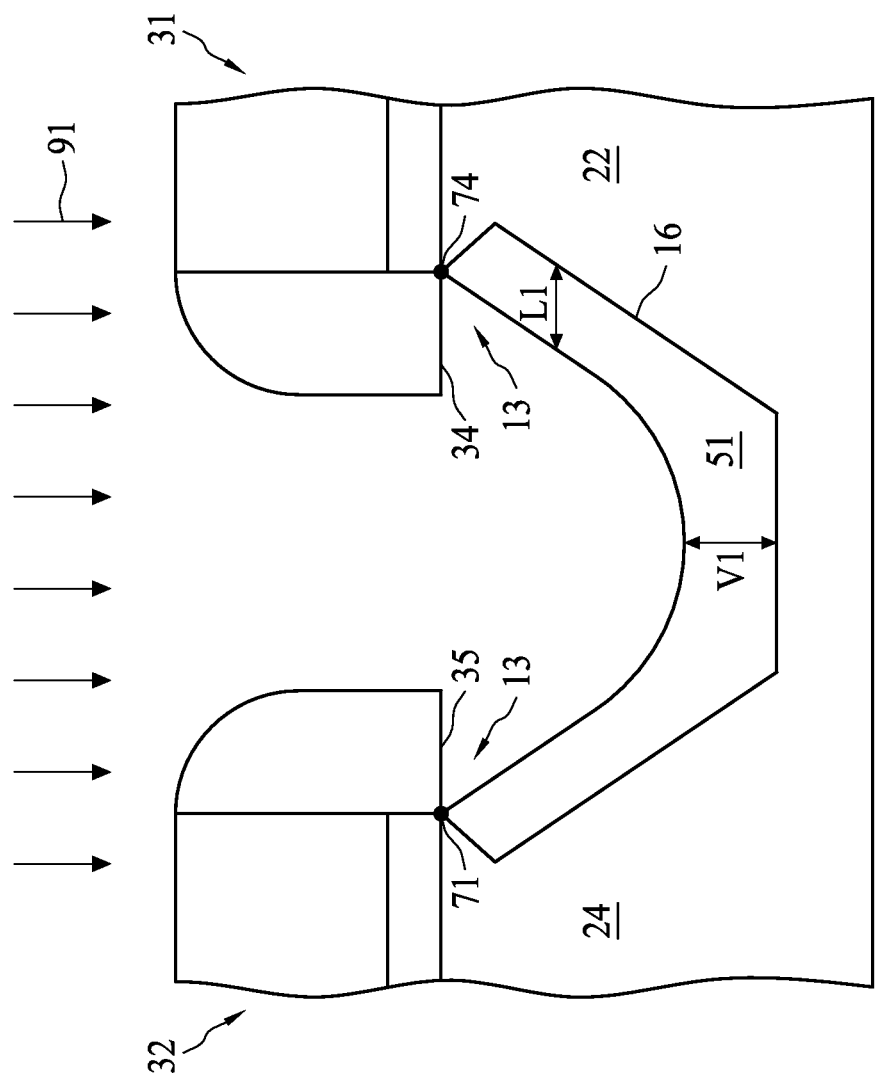

Referring to FIG. 3B, a first epitaxial deposition process 91 is performed to epitaxially grow a first epitaxial-grown doped layer 51. The first epitaxial deposition process 91 selectively deposits within the cavity 12 and the corners 13. That is, the first epitaxial deposition process 91 deposits the bottom surface 16 with the first epitaxial-grown doped layer 51. Portions of the corners 13 are filled up by end portions of the first epitaxial-grown doped layer 51. Ends 71 and 74 of the first epitaxial-grown doped layer 51 intersect with the bottom surfaces 34 and 35. Moreover, the first epitaxial deposition process 91 includes silicon germanium, silicon carbon or single crystalline silicon. In addition, the first epitaxial-grown doped layer 51 is doped in-situ with p-type or n-type dopants during the first epitaxial deposition process 91. The first epitaxial deposition process 91 includes a dopant concentration ranging from about 1e19 atoms per $cm^3$ to about 2e20 atoms per $cm^3$. Particularly, vertical growth of the first epitaxial deposition process 91 is faster than lateral growth of the first epitaxial deposition process in the cavity 12. Thus, a ratio between a lateral thickness L1 and a vertical thickness V1 of the first epitaxial-grown doped layer 51 is less than about 1.

Figure 3C:
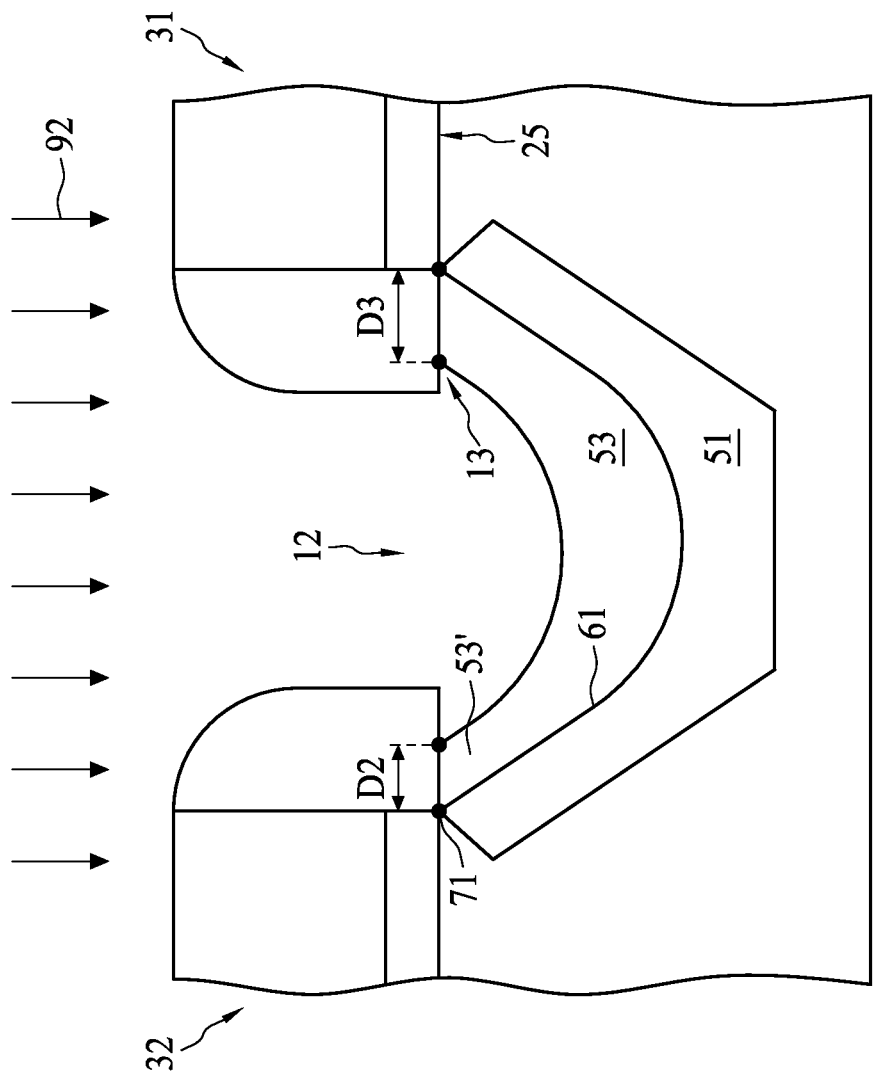

Referring to FIG. 3C, a second epitaxial deposition process 92 is performed to selectively form a second epitaxial-grown doped layer 53 on the first epitaxial-grown doped layer 51. End portions 53' of the second epitaxial-grown doped layer 53 fill the corners 13 between the gate structures (31 or 32) and the first epitaxial-grown doped layer 51. Vertical growth and lateral growth of the second epitaxial deposition process 92 are substantially uniform, thus resulting in the end portion 53' of the second epitaxial-grown doped layer 53. In addition, the second epitaxial deposition process 92 deposits the end portion 53' with a lateral thickness D2 measured from the end 71 of the first epitaxial-grown doped layer 51 on the surface 25. That is, the gate structure 32 makes contact with the second epitaxial-grown doped layer 53 with the lateral thickness D2. Similarly, the gate structure 31 makes contact with the second epitaxial-grown doped layer 53 with a lateral thickness D3. The lateral thickness D2 is substantially the same as the lateral thickness D3.

Furthermore, the semiconductor material of the first epitaxial-grown doped layer 51 serves as a seed for the second epitaxial deposition process 92. The second epitaxial deposition process 92 has an epitaxial semiconductor material that is the same as that of the first epitaxial deposition process 91. In addition, the second epitaxial deposition process 92 includes the same dopant species as the first epitaxial deposition process 91. The second epitaxial deposition process 92 includes a dopant concentration ranging from about 2e20 atoms per $cm^3$ to 6e20 atoms per $cm^3$, which is higher than that of the first epitaxial deposition process 91.

Figure 3D:
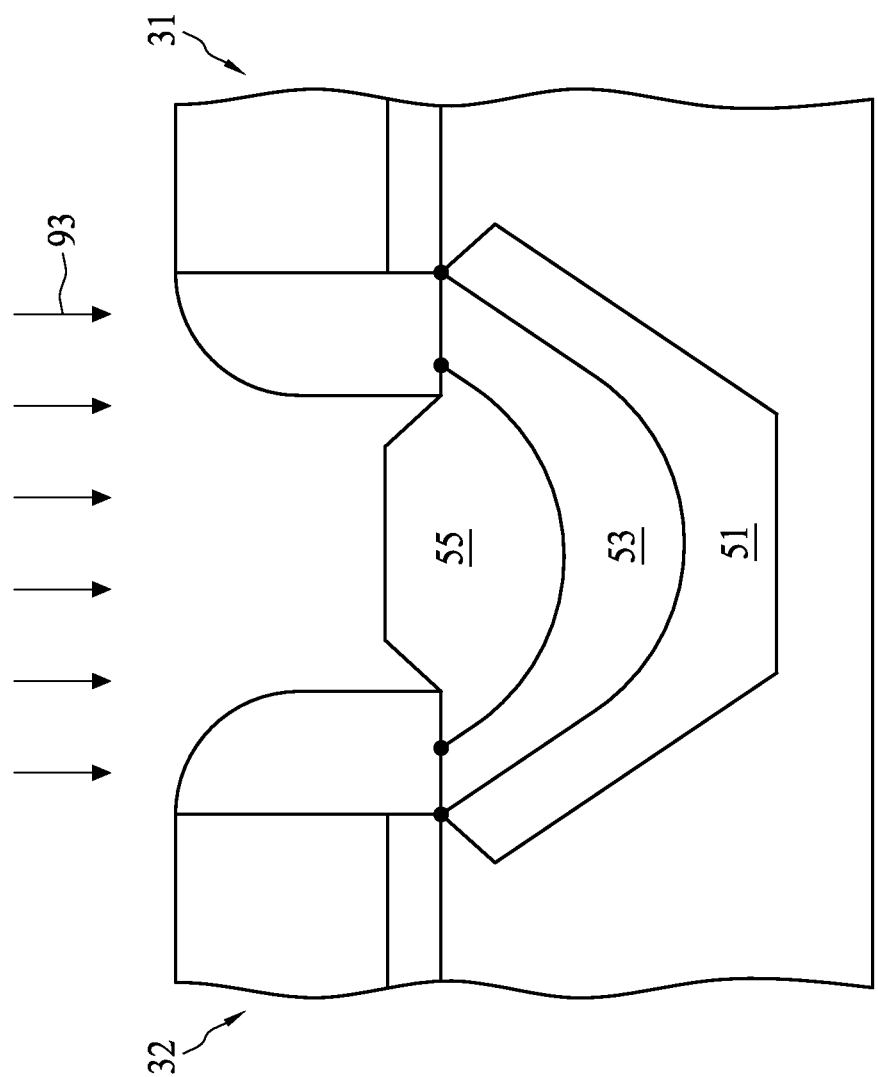

Referring to FIG. 3D, a third epitaxial deposition process 93 is performed to selectively form a third epitaxial-grown doped layer 55 on the second epitaxial-grown doped layer 53. The third epitaxial deposition process 93 backfills a remaining portion of the corners 13 underneath the gate structures 31 and 32 and elevates from the surface 25 of the substrate 10. The third epitaxial deposition process 93 includes an epitaxial semiconductor material that is the same as that of the second epitaxial deposition process 92. In addition, the third epitaxial deposition process 93 includes the same dopant species as the second epitaxial deposition process 92. The third epitaxial deposition process 93 includes a dopant concentration ranging from about 6e20 atoms per $cm^3$ to 2e21 atoms per $cm^3$, which is higher than that of the second epitaxial deposition process 92. In some embodiments, the epitaxial deposition/partial etch process is repeated a number of times until a desired thickness is reached. Such repeated deposition/partial etch process is also called a cyclic deposition/etch (CDE) process.

The first, second, and third epitaxial-grown doped layers (51, 53, 55) fill up the corners 13 so as to form an epitaxy-tip region. By forming the epitaxy-tip region in relatively close proximity to the channel regions 22 and 24, a larger hydrostatic stress is induced on the channel regions 22 and 24, resulting in a higher electron mobility and increased drive current.

As the dopant concentration is higher than 1e21 atoms per $cm^3$, dopants in the third epitaxial-grown doped layer 55 obtain a tendency to diffuse into the channel regions during an optional thermal process. The increase in dopant concentration is for increasing conductivity but can cause a risk by generating short channel problems. Due to the lateral thicknesses D2 and D3, the second epitaxial-grown doped layer 53 serves as a barrier to hinder the dopants in the third epitaxial-grown doped layer 55 from diffusing into the channel regions. A path in the epitaxy-tip region near the surface 25 is grown thicker (the lateral thicknesses D2 and D3) so that the dopants in the third epitaxial-grown doped layer 55 are blocked.

Figure 3E:
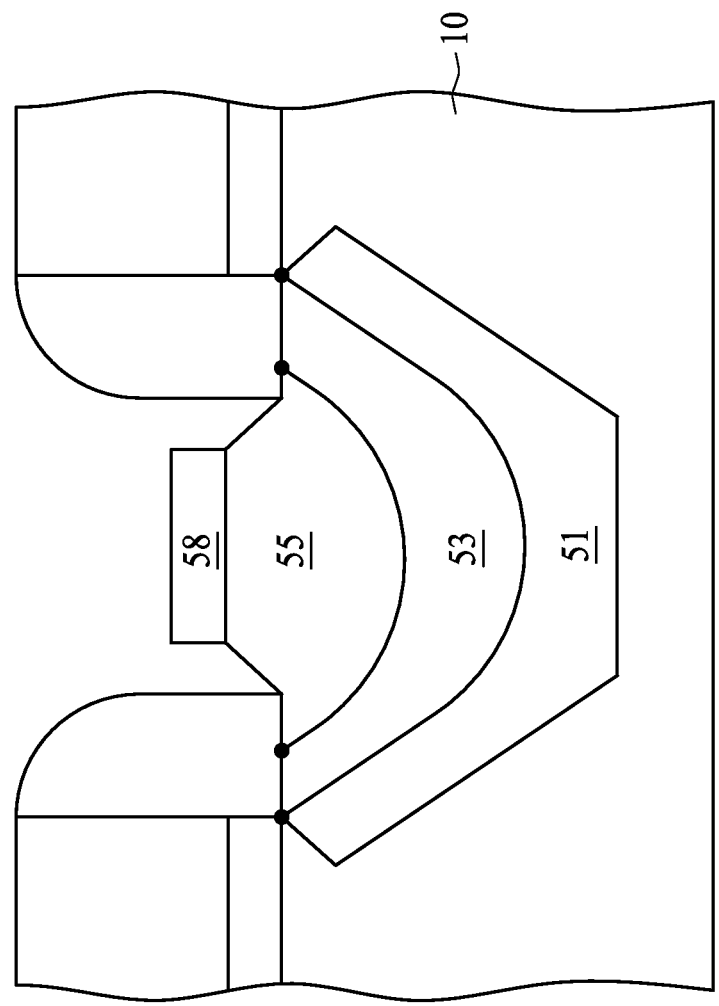

Referring to FIG. 3E, a metal silicide region 58 is formed on the third epitaxial-grown doped layer 55. A metal layer (not shown) is deposited to cover the substrate 10. Exemplary and non-limiting metals that can be deposited include nickel, platinum or titanium, and the metal thickness is preferably several angstroms, such as about 6 angstroms to about 8 angstroms. Later, an annealing process is performed to silicide an upper portion of the third epitaxial-grown doped layer 55. The annealing process thus produces the metal silicide region 58, for example, NiSi, PtSi or TiSi. Remaining portions of the metal layer are stripped by a wet etch or a dry etch.

In brief, the lateral thicknesses (D1, D2, D3) of the second epitaxial-grown doped layer 53 are regarded as barriers that prevent dopants in the third epitaxial-grown doped layer 55 from unintentional diffusion. The dopants in the third epitaxial-grown doped layer 55 are almost confined within the second epitaxial-grown doped layer 53. As such, the lateral thicknesses (D1, D2, D3) prevent the semiconductor device from drain-induced barrier lowering (DIBL) degradation since the dopant diffusion is well controlled. In addition, under the above ratio conditions, the semiconductor device 100 provides a better electrical property.

In some embodiments, a semiconductor device includes a gate structure located on a substrate and a raised source/ drain region adjacent to the gate structure. The raised source/drain region includes: a first epitaxial-grown doped layer of the raised source/drain region in contact with the substrate; a second epitaxial-grown doped layer on the first epitaxial-grown doped layer and including a same dopant species as the first epitaxial-grown doped layer, wherein the second epitaxial-grown doped layer includes a higher dopant concentration than the first epitaxial-grown doped layer and interfacing the gate structure by using a predetermined distance; and a third epitaxial-grown doped layer on the second epitaxial-grown doped layer and including the same dopant species as the first epitaxial-grown doped layer, wherein the third epitaxial-grown doped layer includes a higher dopant concentration than the second epitaxial-grown doped layer.

In some embodiments, the first epitaxial-grown doped layer includes a first vertical thickness. The second epitaxial-grown doped layer includes a second vertical thickness. A ratio between the second vertical thickness and the first vertical thickness is greater than about 0.8.

In some embodiments, the third epitaxial-grown doped layer includes a third vertical thickness. A ratio between the third vertical thickness and a combination of the first vertical thickness and the second vertical thickness is less than about 0.5.

In some embodiments, end portions of the first and second epitaxial-grown doped layers are underneath the gate structure.

In some embodiments, the end portion of the first epitaxial-grown doped layer is more proximal to a channel region than the end portion of the second epitaxial-grown doped layer.

In some embodiments, an end portion of the third epitaxial-grown doped layer is under the gate structure. A central portion of the third epitaxial-grown doped layer raises from a surface of the substrate.

In some embodiments, the first epitaxial-grown doped layer is a U-shaped structure in the substrate.

In some embodiments, the first epitaxial-grown doped layer includes an epitaxial semiconductor material that is the same as that of the second epitaxial-grown doped layer and the third epitaxial-grown doped layer.

In some embodiments, the first epitaxial-grown doped layer includes a dopant concentration ranging from about 1e19 atoms per $cm^3$ to about 2e20 atoms per $cm^3$; the second epitaxial-grown doped layer includes a dopant concentration ranging from about 2e20 atoms per $cm^3$ to 6e20 atoms per $cm^3$; and the third epitaxial-grown doped layer includes a dopant concentration ranging from about 6e20 atoms per $cm^3$ to 2e21 atoms per $cm^3$.

In some embodiments, a semiconductor device includes a gate structure located on a substrate and a raised source/drain region adjacent to the gate structure. The raised source/drain region includes: a first epitaxial-grown doped liner of the raised source/drain region in contact with the substrate; a second epitaxial-grown doped liner on the first epitaxial-grown doped liner, wherein an end of the second epitaxial-grown doped liner includes a lateral thickness measured from an end of the first epitaxial-grown doped liner on a surface of the substrate; a third epitaxial-grown doped liner on the second epitaxial-grown doped liner, wherein the third epitaxial-grown doped liner is encompassed by the second epitaxial-grown doped liner, and the lateral thickness separates the third epitaxial-grown doped liner from a channel region under the gate structure.

In some embodiments, the first epitaxial-grown doped liner includes a lateral thickness and a vertical thickness. A ratio between the lateral thickness and the vertical thickness is less than about 1.

In some embodiments, a ratio between the lateral thickness and a vertical thickness of the second epitaxial-grown doped liner is in a range from 0.5 to 1.

In some embodiments, the lateral thickness of the second epitaxial-grown doped liner is in a range from about 50 angstroms to 200 angstroms.

In some embodiments, the third epitaxial-grown doped liner includes a dopant concentration from about 10 to 100 times higher than that of the second epitaxial-grown doped liner.

In some embodiments, a method for manufacturing a semiconductor device includes: providing a substrate including a gate structure on the substrate; forming a cavity in the substrate and adjacent to the gate structure by an etching process; performing a first epitaxial deposition process to form a first epitaxial-grown doped layer on a bottom surface of the cavity; performing a second epitaxial deposition process to form a second epitaxial-grown doped layer on the first epitaxial-grown doped layer, wherein an end portion of the second epitaxial-grown doped layer fills a corner between the gate structure and the first epitaxial-grown doped layer; and performing a third epitaxial deposition process to form a third epitaxial-grown doped layer on the second epitaxial-grown doped layer, wherein the third epitaxial deposition process backfills a remaining portion of the corner underneath the gate structure and elevates from a surface of the substrate.

In some embodiments, the second epitaxial deposition process deposits the end portion with a lateral thickness measured from an end of the first epitaxial-grown doped layer on the surface of the substrate.

In some embodiments, vertical growth of the first epitaxial deposition process is faster than lateral growth of the first epitaxial deposition process in the cavity.

In some embodiments, vertical growth and lateral growth of the second epitaxial deposition process are substantially uniform, thus resulting in the end portion of the second epitaxial-grown doped layer.

In some embodiments, the first, second and third epitaxial deposition process includes in-situ dopants. The first epitaxial deposition process includes a dopant concentration ranging from about 1e19 atoms per $cm^3$ to about 2e20 atoms per $cm^3$. The second epitaxial deposition process includes a dopant concentration ranging from about 2e20 atoms per $cm^3$ to 6e20 atoms per $cm^3$. The third epitaxial deposition process includes a dopant concentration ranging from about 6e20 atoms per $cm^3$ to 2e21 atoms per $cm^3$.

In some embodiments, the etching process is an isotropic etch that undercuts a portion of the substrate under the gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a gate structure located on a substrate, comprising:
  a gate dielectric;
  a gate electrode over the gate dielectric; and
  a sidewall spacer laterally abutting the gate dielectric and the gate electrode;
a raised conductive region adjacent to and partially under the gate structure, wherein the raised conductive region comprises:
a first epitaxial-grown doped layer of the raised conductive region in contact with the substrate, the first epitaxial-grown doped layer including an elbow angle under the gate dielectric and the first epitaxial-grown doped layer interfacing the gate structure at a first point directly aligned with a vertical sidewall of the sidewall spacer contacting the gate dielectric;
a second epitaxial-grown doped layer on the first epitaxial-grown doped layer and including a same dopant species as the first epitaxial-grown doped layer, wherein the second epitaxial-grown doped layer having a higher dopant concentration than the first epitaxial-grown doped layer, the second epitaxial-grown doped layer interfacing the gate structure along a bottom of the sidewall spacer from the first point to a second point under the bottom of the sidewall spacer away from the first point and the gate dielectric; and
a third epitaxial-grown doped layer on the second epitaxial-grown doped layer and including the same dopant species as the first epitaxial-grown doped layer, wherein the third epitaxial-grown doped layer comprises a higher dopant concentration than the second epitaxial-grown doped layer, and the third epitaxial-grown doped layer interfacing the gate structure at least at the second point,
  wherein the dopant concentration is constant throughout each of the epitaxial-grown doped layers.

2. The semiconductor device of claim 1, wherein the first epitaxial-grown doped layer comprises a first vertical thickness and the second epitaxial-grown doped layer comprises a second vertical thickness, and a ratio between the second vertical thickness and the first vertical thickness is greater than about 0.8.

3. The semiconductor device of claim 2, wherein the third epitaxial-grown doped layer comprises a third vertical thickness, and a ratio between the third vertical thickness and a combination of the first vertical thickness and the second vertical thickness is less than about 0.5.

4. The semiconductor device of claim 1, wherein a central portion of the third epitaxial-grown doped layer raises from a surface of the substrate.

5. The semiconductor device of claim 1, wherein the first epitaxial-grown doped layer is a U-shaped structure in the substrate.

6. The semiconductor device of claim 1, wherein the first epitaxial-grown doped layer comprises an epitaxial semiconductor material that is the same as that of the second epitaxial-grown doped layer and the third epitaxial-grown doped layer.

7. The semiconductor device of claim 1, wherein the first epitaxial-grown doped layer comprises a dopant concentration ranging from about 1e19 atoms per $cm^3$ to about 2e20 atoms per $cm^3$, the second epitaxial-grown doped layer comprises a dopant concentration ranging from about 2e20 atoms per $cm^3$ to 6e20 atoms per $cm^3$, and the third epitaxial-grown doped layer comprises a dopant concentration ranging from about 6e20 atoms per $cm^3$ to 2e21 atoms per $cm^3$.

8. The semiconductor device of claim 1, wherein the first epitaxial-grown doped layer is separated from the third epitaxial-grown doped layer by the first point and the second point.

9. The semiconductor device of claim 1, wherein the first point is separated from the second point by a width of from about 1 angstrom to about 100 angstrom.

10. The semiconductor device of claim 1, wherein the elbow angle of the first epitaxial-grown doped layer is not interfacing with the gate structure.

11. The semiconductor device of claim 1, wherein a separation between the first point and the second point is less than a width of the sidewall spacer.

12. A semiconductor structure, comprising:
a gate structure located on a substrate, comprising:
  a gate dielectric;
  a gate electrode over the gate dielectric; and
  a sidewall spacer laterally abutting the gate dielectric and the gate electrode;
a raised conductive region adjacent to and partially under the gate structure, wherein the raised conductive region comprises:
a first epitaxial-grown doped liner of the raised conductive region in contact with the substrate, comprising a first lateral thickness and a first vertical thickness, a ratio between the first lateral thickness and the first vertical thickness being less than about 1, the first epitaxial-grown doped liner including an elbow angle under the gate dielectric and the first epitaxial-grown doped liner interfacing the gate structure at a first point aligned with a vertical sidewall of the sidewall spacer contacting the gate dielectric;
a second epitaxial-grown doped liner on the first epitaxial-grown doped liner, the second epitaxial-grown doped liner interfacing the gate structure along a bottom of the sidewall spacer from the first point to a second point under the bottom of the sidewall spacer away from the first point and the gate dielectric, a separation between the first point and the second point comprising a second lateral thickness; and
a third epitaxial-grown doped liner on the second epitaxial-grown doped liner, the third epitaxial-grown doped liner interfacing the gate structure at least at the second point,
  wherein the dopant concentration is constant throughout each of the epitaxial-grown doped layers.

13. The semiconductor device of claim 12, wherein a ratio between the second lateral thickness and a second vertical thickness of the second epitaxial-grown doped liner is in a range from about 0.5 to about 1.

14. The semiconductor device of claim 12, wherein the second lateral thickness of the second epitaxial-grown doped liner is in a range from about 50 angstroms to 200 angstroms.

15. The semiconductor device of claim 12, wherein the third epitaxial-grown doped liner comprises a dopant concentration from about 10 to 100 times higher than that of the second epitaxial-grown doped liner.

16. The semiconductor device of claim 12, wherein the second epitaxial-grown doped liner is configured to prevent dopant diffusion between the third epitaxial-grown doped liner and the substrate.

17. The semiconductor device of claim 12, wherein the second epitaxial-grown doped liner is configured to prevent lateral dopant diffusion between the third epitaxial-grown doped liner and the channel region.

18. The semiconductor device of claim 12, wherein the elbow angle of the first epitaxial-grown doped layer is not interfacing with the gate structure.

19. The semiconductor device of claim 12, wherein the second lateral thickens is from about 1 angstrom to about 100 angstrom.

20. The semiconductor device of claim 12, wherein the second lateral thickness is less than a width of the sidewall spacer.

* * * * *